(12) United States Patent
Hammiche et al.

(10) Patent No.: US 10,586,840 B2
(45) Date of Patent: Mar. 10, 2020

(54) TFT DISPLAY SCREEN DEVICE

(71) Applicant: Visteon Global Technologies, Inc., Van Buren Township, MI (US)

(72) Inventors: Yahia Hammiche, Argenteuil (FR); John Cummings, Maisons-Laffitte (FR)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 16/181,748

(22) Filed: Nov. 6, 2018

(65) Prior Publication Data

US 2019/0157366 A1 May 23, 2019

(30) Foreign Application Priority Data

Nov. 6, 2017 (FR) ..................... 17 60386

(51) Int. Cl.
*H01L 27/32* (2006.01)
*H01L 27/12* (2006.01)
*B60K 35/00* (2006.01)
*H04W 4/02* (2018.01)
*G01C 21/36* (2006.01)
*G06F 3/0481* (2013.01)
*G01D 7/00* (2006.01)
*G01J 1/42* (2006.01)
*G01J 1/02* (2006.01)

(52) U.S. Cl.
CPC .......... *H01L 27/3262* (2013.01); *B60K 35/00* (2013.01); *G01C 21/3667* (2013.01); *G01D 7/00* (2013.01); *G06F 3/04817* (2013.01); *H01L 27/1218* (2013.01); *H04W 4/02* (2013.01); *G01J 1/0271* (2013.01); *G01J 1/4228* (2013.01)

(58) Field of Classification Search
CPC ............ B60K 35/00; B60K 2350/1004; B60K 2350/1064; B60K 2350/1068; B60K 2350/1072; B60K 2350/1032; G01C 21/3667; G01D 7/00; G06F 3/04817; H01L 27/1218; H01L 27/3262; H04W 4/02; G01J 1/0271; G01J 1/4228; G09G 3/36; G09G 2380/10; G09G 2360/145; G09G 2320/0252
See application file for complete search history.

(56) References Cited

U.S. PATENT DOCUMENTS

2001/0024361 A1 9/2001 Suzuki et al.
2015/0210212 A1 7/2015 Schwantner

*Primary Examiner* — Nelson M Rosario
(74) *Attorney, Agent, or Firm* — Quinn IP Law

(57) ABSTRACT

A TFT display screen device includes at least one active zone whose pixels are used for the display of an instrument cluster and the display of one or more warning or alarm), optionally icons inlaid in the instrument cluster. The screen also includes at least one dead zone not visible to the user. At least one dead zone is provided-with at least one light sensor and at least one control pixel which is activated when the single icon or at least one icon with which it is associated, is displayed in the active zone of the screen. The sensor is adapted to detect the activation of said at least one control pixel and to deliver a signal.

19 Claims, 2 Drawing Sheets

TFT DISPLAY SCREEN DEVICE

CROSS REFERENCE TO RELATED APPLICATIONS

This application claims the benefit of French Patent Application No. 1760386 filed on Nov. 6, 2017 and entitled "Dispositif d'écran d'affichage TFT" which is incorporated by reference in its entirety in this disclosure.

TECHNICAL FIELD

This invention relates to the field of display and its corresponding equipment, in particular TFT screens, and has for its subject-matter an improved TFT display screen device, a motor vehicle comprising such a screen and a method to verify good operation of such a screen.

BACKGROUND

Currently, at the level of a dashboard, the information displays necessary for driving a motor vehicle (running speed, engine rotation speed, fuel level, . . . ) are increasingly in a virtual format (that is to say as images) via a reconfigurable screen, comprising an active matrix, generally of the Thin Film Transistor (TFT) type.

These TFT screens can usually be used simultaneously to display a GPS map provided by a browser, in a specific region or in the background.

In addition, the dashboard generally also has warning or alarm warning lights, which can be made separately and independently of such a screen (in the form of LED lights or display screens), either integrated into the TFT screen as icons that may selectively appear on the display surface, in strong contrast with the bottom of the screen.

Such a display screen generally comprises at least one active zone whose pixels are used, permanently or occasionally at least, for the display of said instrument cluster, and possibly a map, and the display of one or more warning or alarm icon(s), optionally inlaid in the instrument cluster and/or the map, the screen also comprising at least one dead zone, the pixels of which are never used for displaying the instrument cluster or the map, or for the display of icon(s).

When serving to give directions and safety information, the display of the icons must be guaranteed.

However, for separate indicator lamps it is only necessary to control their power supply to determine their operating status. Such verification, which would ensure the correct display of an embedded icon, is impossible with active matrix displays (TFT).

Indeed, a good power supply, or even an adequate operation of the control circuits of the region(s) of the screen assigned(s) to the display of the icon(s), does not guarantee that the latter are actually visible on the screen when they should be.

Moreover, the manufacturers of such screens do not provide any guarantee as to the information displayed, but only as to the correct operation of the screen control.

In an attempt to overcome this limitation, checking the content of the display of such screens before their installation has been proposed, by means of a system comprising a plurality of cameras arranged opposite the screen and revealing each display of information in a particular region of this screen. A comparison is made between the content of the image whose display has been ordered for a region in question and the content of the image revealed by the camera associated with this region, and the quality of the screen's operation is deduced therefrom and from its control in this manner during the aforementioned testing phase (see "Putting instrument panel through their paces", Paul Jones, Vision Systems Design, Jan. 14, 2014).

However, this known system is complex and expensive, and the verification process tedious. In addition, this test can be performed on-board and is performed only once before installation in situ of the screen, in connection with a specific display setting.

SUMMARY

The present invention aims to overcome the above disadvantages, while overcoming the limitations mentioned above.

To that end, the subject-matter of the invention is a TFT display screen device, forming a dashboard screen for a group of virtual or reconfigurable instruments and possibly a GPS map or the like, said screen comprising at least one active zone whose pixels are used, permanently or occasionally at least, for the display of said instrument cluster, and possibly a map, and the display of one or more warning or alarm icon(s), possibly embedded in the instrument cluster and/or the map, the screen also comprising at least one dead zone, the pixels of which are never used for displaying the instrument cluster or the map, or for the display of icon(s), and preferentially not visible to the user, a screen device characterized in that said at least one dead zone is provided, on the one hand, with at least one light sensor and, on the other hand, with at least one control pixel which is activated when a single icon, or at least one specific icon associated with it, is displayed in the active area of the screen, said sensor being adapted and intended to detect the activation of said at least one control pixel and to deliver in this case a measurement or selective detection signal to a processing unit verifying and/or managing the operation and display of the screen.

The above features and advantages and other features and advantages of the present teachings are readily apparent from the following detailed description of the best modes for carrying out the teachings when taken in connection with the accompanying drawings.

BRIEF DESCRIPTION OF THE DRAWINGS

The invention will be better understood, by means of the description below, relative to a preferred embodiment, given as a non-restrictive example, and explained with reference to the attached schematic drawings, in which.

Figure 1:
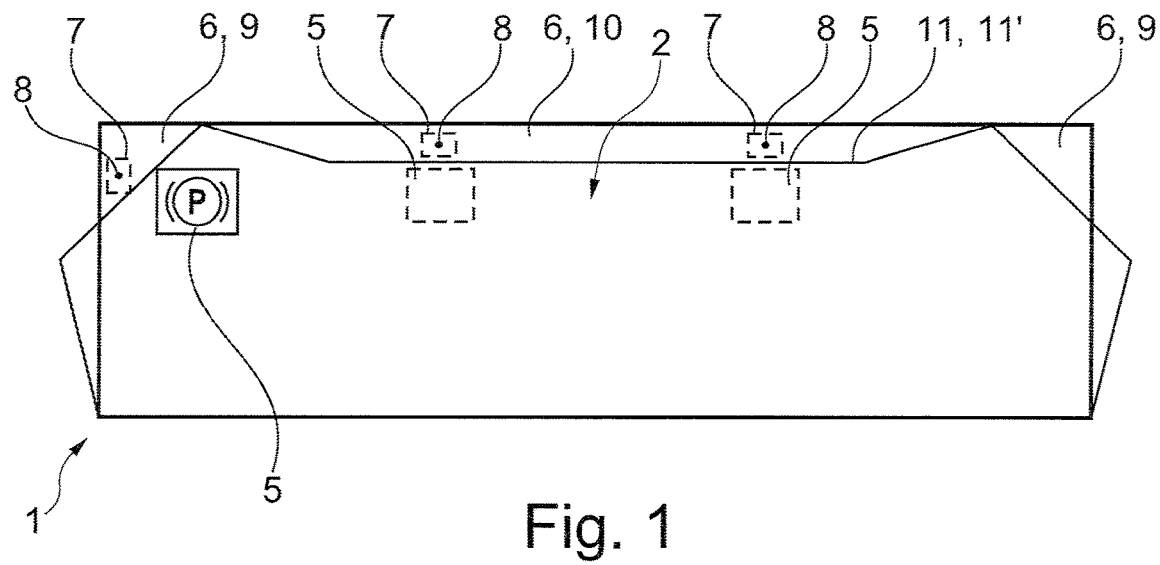
FIG. 1 is a schematic representation of a screen device according to the invention.
Figure 2:
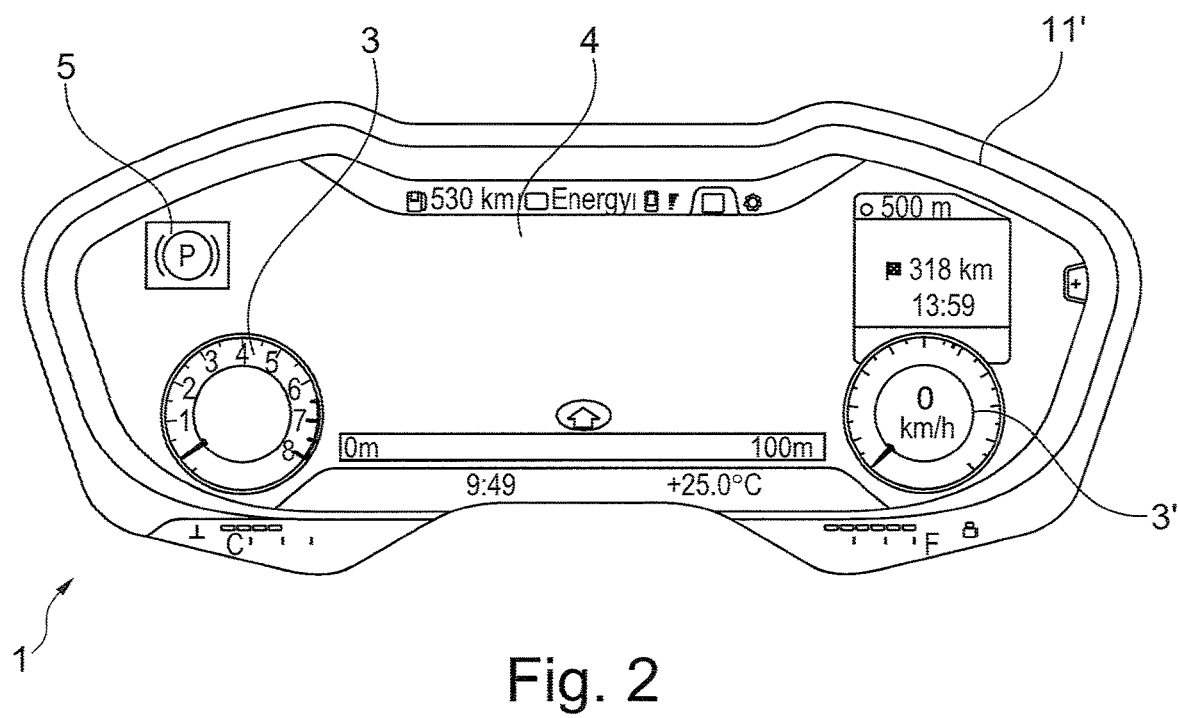
FIG. 2 is a front view of a screen according to the invention in operation in a moving vehicle.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure as encompassed by the appended claims.

DETAILED DESCRIPTION

Those having ordinary skill in the art will recognize that terms such as "above," "below," "upward," "downward,"

"top," "bottom," etc., are used descriptively for the figures, and do not represent limitations on the scope of the disclosure, as defined by the appended claims. Furthermore, the teachings may be described herein in terms of functional and/or logical block components and/or various processing steps. It should be realized that such block components may be comprised of any number of hardware, software, and/or firmware components configured to perform the specified functions.

Figure 3:
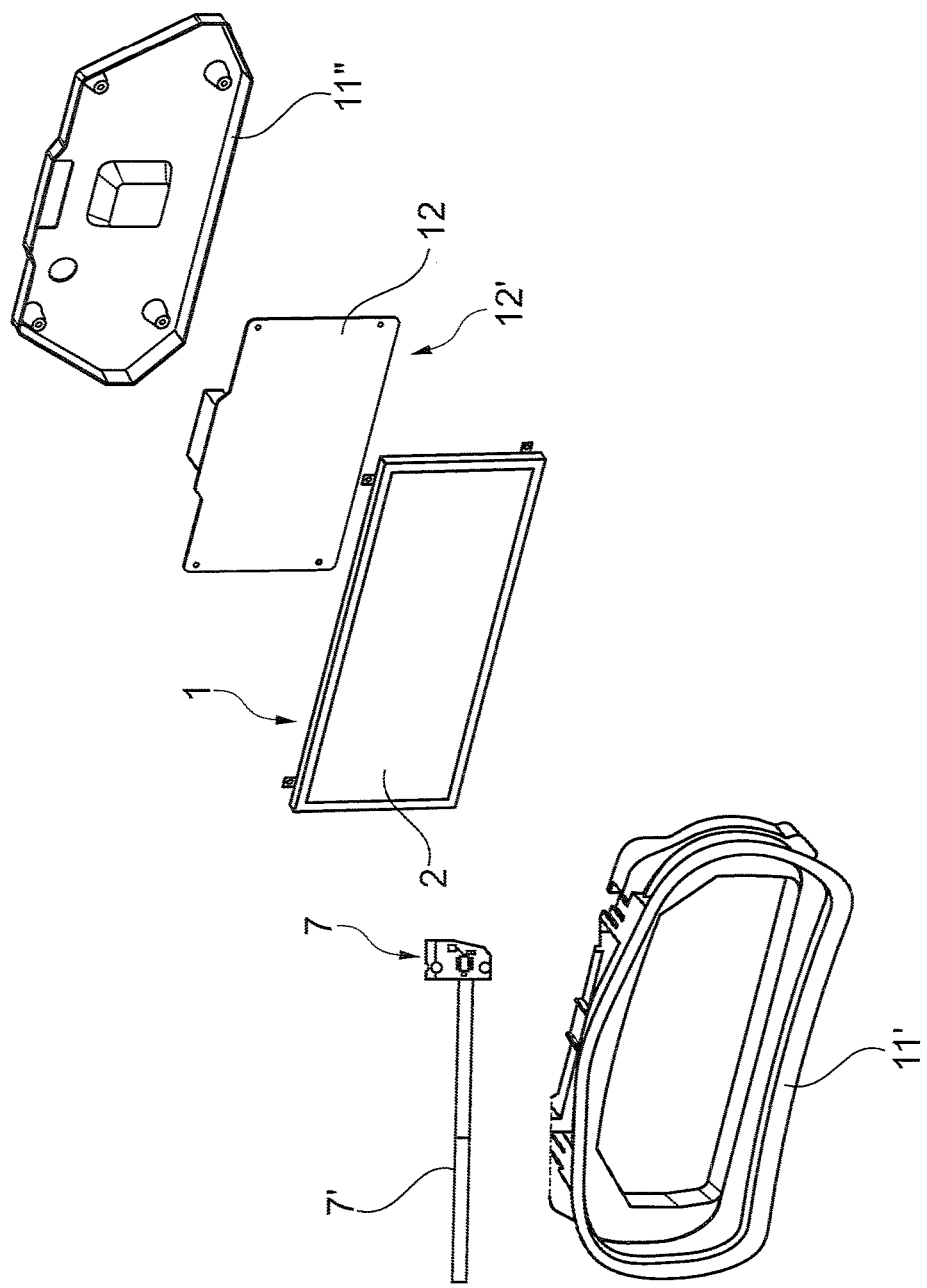
FIG. 3 is an exploded view in perspective of a screen device, according to an example of a practical embodiment of the invention.

The invention concerns, as shown in FIGS. 1 and 3, to a TFT display screen device forming a dashboard screen 1 for a group of virtual or reconfigurable instruments 3, 3' and possibly a GPS map 4 or the like.

This screen 1 comprises at least one active zone 2 whose pixels are used, permanently or occasionally at least, for the display of said instrument cluster 3, 3', and possibly a map 4, and for the display of one or more warning or alarm icon(s) 5, optionally embedded in the instrument cluster 3, 3' and/or the map 4. The screen 1 also comprises at least one dead zone 6, whose pixels are never used neither for the display of the instrument group or the map, nor for the display of icon(s) (and advantageously not visible to the user).

According to the invention, said at least one dead zone 6 is provided, on the one hand, with at least one light sensor 7 and, on the other hand, with at least one control pixel 8 which is activated when the single icon 5, or at least one specific icon 5 with which it is associated, is displayed in the active zone 2 of the screen 1, said sensor 7 being adapted and intended to detect the activation of said at least one control pixel 8 and in this case, delivering a measurement or selective detection signal to a processing unit 14 verifying and/or managing the operation and display of screen 1.

Thanks to the invention, it is therefore possible to overcome the limitations of the Prior Art by providing a simple solution that can be on board and able to carry out repeated functional tests, after the installation of the screen in its environment of use and throughout its life.

Advantageously, screen 1 (in other words the panel forming the screen) has a rectangular shape and said at least one dead zone corresponds to a corner region 9 of the rectangular visible surface of screen 1.

In addition or alternatively, said at least one dead zone 6 corresponds to at least one sideband portion 10, or even to a peripheral frame, of the visible surface of screen 1.

When screen 1 has several dead zones 6, only one or some of them can be equipped with the control pixel(s) 8, this will depend on the number and the implantation of the icon(s) 5.

Similarly, screen 1 may comprise only a single dead zone 6 with several control pixels 8 associated with several respective icons 5, this being in relation with one or more sensor(s) 7.

According to a characteristic of the invention, in order to facilitate practical implementation, it may be provided that the or each control pixel 8 may be located on the same line or on the same column of the active-matrix TFT of screen 1 as that of the at least one of the pixels of the active area 2 which is activated when displaying the warning or alarm icon 5 associated with the control pixel 8 considered.

In most applications, the active area 2 of screen 1 is configured to display several separate and independent warning or alarm icons 5, and in that each icon 5 is associated with at least one control pixel 8, preferably a group of mutually adjacent control pixels 8, one or more sensor(s) 7 being provided to detect the activation of the different control pixels 8.

In accordance with an advantageous embodiment, useful when the active area 2 of screen 1 is configured to display a plurality of separate and independent warning or alarm icons 5, it can be provided that the screen device comprises at least two control pixels 8 arranged at two adjacent sides of the rectangular screen 1 and enabling, in connection with a verification of their display, a two-dimensional identification discriminating each of at least two icons 5 displayed in the active area 2 and visible to the user.

Such a matrix detection arrangement makes it possible to individually identify the operating status of several icons 5 arranged on the same line or the same column of screen 1.

FIG. 1 shows the systematic presence of a sensor 7 in a dead zone 6 (upper left corner 9 of screen 1), assigned to an icon 5 (solid line), in the case where only one icon is present. Other sensors 7' located in at least one other dead zone 6 (sideband 10 of screen 1) can be provided when other icons 5 (dotted lines) are present (possibly on the same lines on the visible display surface of screen 1).

Preferably, the sensor or each light sensor 7 is a camera.

So as to not disturb the use of screen 1, the dead zone 6 is covered with an opaque layer 11 in its installation and normal use environment, in the form of a shell, a cover, a film, a housing part, a recess or flange, or the like.

FIG. 3 illustrates, in the disassembled state, an exemplary practical embodiment of a screen device according to the invention.

More specifically, this device comprises: a TFT screen panel 1, a control board 12' (printed circuit board) comprising the processing and administrative unit 12 for screen 1, a front frame or mask 11' delimiting the visible display surface for the user and providing the opaque layer(s) 11 covering the dead area(s) 6. A rear closure plate 11", intended to form a protective housing together with the front frame 11', receiving components 1 and 12' and housing the sensor(s) 7 and their connections, can also be provided.

Finally, FIG. 3 also shows a light sensor 7 (for example a mini CCD camera) and its means of connection 7' to the control map 12' (here in the form of a flexible printed circuit).

As indicated above, this sensor 7 is housed, in the assembled state of the device, between the frame 11' and the screen 1 (being oriented towards a control pixel or a group of control pixels 8 of a dead zone 6).

The invention also has for its subject-matter a motor vehicle having a dashboard equipped with a TFT display suitable for displaying a group of virtual instruments, at least one warning or alarm icon and, where appropriate, a scalable and interactive GPS map, vehicle characterized in that said screen 1 is a screen device as described above.

The implementation of the invention also makes it possible at least partially to meet some of the requirements in terms of operational safety of the ISO 26262 standard.

Finally, the invention also relates to a method of verifying the operation of a TFT display screen designed for use as a dashboard screen for a group of virtual or reconfigurable instruments, and where appropriate, a map, such as described above.

This screen comprises at least one active zone 2 whose pixels are used, permanently or occasionally at least, for the display of said instrument cluster 3, 3', and possibly a map 4, and the display of one or more warning or alarm icon(s) 5, optionally inlaid in the instrument cluster 3, 3' or the map 4, the screen 1 also comprising at least one dead zone 6, the pixels of which are never used for displaying the instrument cluster or the map, or for the display of icon(s).

This process is characterized in that it consists of provision before said dead zone 6 of at least one light sensor 7 and, secondly, of at least one control pixel 8 which is activated when the single icon 5 or a specific icon 5 which is associated with it, is displayed in the active zone 2 of screen 1, said sensor 7 being adapted and intended to detect the activation of said at least one control pixel 8 and to deliver in this case a detection signal to a processing unit verifying and/or administering the operation and display of screen 1, and, when checking the effective display of the icons 5, activating one by one the various icons 5, to be read by means of the sensor 7, the activation of the control pixels 8, or groups of control pixels 8 respectively associated with each of the icons 5, to emit, at the sensor 7, a measurement signal or a signal that is indicative of the activation state as a function of what was identified by said sensor 7 during the various activation phases and, after evaluation, to provide information as to the operation of said screen 1 in connection with the display of the icons 5, and possibly tested in connection with the display of other functionalities of said screen 1.

Of course, the invention is not limited to the embodiment described and shown in the attached drawings. Modifications remain possible, in particular from the point of view of the makeup of the various items or by substituting technical equivalents, without completely departing from the field of invention protection. The detailed description and the drawings or figures are supportive and descriptive of the disclosure, but the scope of the disclosure is defined solely by the claims. While some of the best modes and other embodiments for carrying out the claimed teachings have been described in detail, various alternative designs and embodiments exist for practicing the disclosure defined in the appended claims.

The invention claimed is:

1. A vehicle dashboard screen comprising:
    a thin-film transistor (TFT) display screen, wherein the display screen includes:
        at least one active zone of the display screen, the at least one active zone including pixels configured to generate and display one or more of an instrument cluster, a map and one or more alarm icons, and
        at least one dead zone of the display screen, wherein the at least one dead zone includes at least one control pixel;
    a processing unit in communication with the at least one active zone of the display screen and the at least one dead zone of the display screen for administering operation of the display screen; and
    at least one light sensor in communication with the processing unit and disposed adjacent the at least one control pixel on the at least one dead zone of the display screen to detect activation of the at least one control pixel,
    wherein the processing unit manages operation of the display screen in response to the at least one light sensor transmitting a signal to the processing unit indicative of the activation state of the at least one control pixel in the at least one dead zone of the display screen.

2. The vehicle dashboard screen of claim 1, wherein the display screen includes a surface that is rectangular in shape, wherein the at least one dead zone of the display screen corresponds to a corner region of the rectangular surface of the display screen.

3. The vehicle dashboard screen of claim 1, wherein the at least one dead zone of the display screen corresponds to at least one of at least one sideband portion and a peripheral frame of the surface of display screen.

4. The vehicle dashboard screen of claim 1, wherein each control pixel is located on a same line or on a same column of the display screen as that of the at least one of the pixels of the active zone which is activated when displaying the warning or alarm icon associated with the control pixel.

5. The vehicle dashboard screen of claim 1, wherein the active area of the display screen is configured to display several alarm icons wherein each alarm icon is associated with at least one control pixel.

6. The vehicle dashboard screen of claim 1, wherein the active zone of the display screen is configured to display a plurality of alarm icons, wherein at least two control pixels are arranged at two adjacent sides of the display screen and enabling, in connection with a verification of their display, a two-dimensional identification distinguishing each of at least two alarm icons displayed in the active zone of the display screen.

7. The vehicle dashboard screen of claim 1, wherein the at least one light sensor is a camera.

8. The vehicle dashboard screen of claim 1 further comprising a front frame disposed proximate the display screen, wherein the front frame includes at least one opaque layer covering the at least one dead zone of the display screen.

9. The vehicle dashboard screen of claim 8 further comprising a housing including a rear closure plate cooperating with the front frame.

10. A vehicle dashboard screen comprising:
    a housing including a front frame and a rear closure plate cooperating with the front frame;
    a thin-film transistor (TFT) display screen, wherein the display screen includes:
        at least one active zone of the display screen, the at least one active zone including pixels configured to generate and display one or more of an instrument cluster, a map and one or more alarm icons, and
        at least one dead zone of the display screen, wherein the at least one dead zone includes at least one control pixel;
    a processing unit in communication with the at least one active zone of the display screen and the at least one dead zone of the display screen for administering operation of the display screen; and
    at least one light sensor in communication with the processing unit and disposed adjacent the at least one control pixel on the at least one dead zone of the display screen to detect activation of the at least one control pixel,
    wherein the processing unit manages operation of the display screen in response to the at least one light sensor transmitting a signal to the processing unit indicative of the activation state of the at least one control pixel in the at least one dead zone of the display screen.

11. The vehicle dashboard screen of claim 10 wherein the display screen includes a surface that is rectangular in shape, wherein the at least one dead zone of the display screen corresponds to a corner region of the rectangular surface of the display screen.

12. The vehicle dashboard screen of claim 10, wherein the at least one dead zone of the display screen corresponds to at least one of at least one sideband portion and a peripheral frame of the surface of display screen.

13. The vehicle dashboard screen of claim 10, wherein the active zone of the display screen is configured to display a plurality of alarm icons, wherein at least two control pixels are arranged at two adjacent sides of the display screen and enabling, in connection with a verification of their display, a two-dimensional identification distinguishing each of at least two alarm icons displayed in the active zone of the display screen.

14. The vehicle dashboard screen of claim 10, wherein the at least one light sensor is a camera.

15. The vehicle dashboard screen of claim 10 wherein the front frame includes at least one opaque layer covering the at least one dead zone of the display screen.

16. A method of managing operation of a vehicle dashboard screen, the method comprising:
    providing a thin-film transistor (TFT) display screen, wherein the display screen includes:
        at least one active zone of the display screen, the at least one active zone including pixels configured to generate and display one or more of an instrument cluster, a map and one or more alarm icons, and
        at least one dead zone of the display screen, wherein the at least one dead zone includes at least one control pixel;
    providing a processing unit in communication with the at least one active zone of the display screen and the at least one dead zone of the display screen for administering operation of the display screen;
    providing at least one light sensor in communication with the processing unit and disposed adjacent the at least one control pixel on the at least one dead zone of the display screen;
    activating the at least one control pixel in the at least one dead zone of the display screen in response to activation of one or more of the alarm icons on the at least one active zone of the display screen;
    detecting activation, with the at least one light sensor, of the at least one control pixel;
    transmitting a signal, with the at least one light sensor, to the processing unit indicative of the activation state of the at least one control pixel in the at least one dead zone of the display screen; and
    operating, with the processing unit, the display screen in response to the at least one light sensor detecting the activation state of the at least one control pixel in the at least one dead zone of the display screen.

17. The method of claim 16 further comprising displaying several alarm icons in the at least one active zone of the display screen, wherein each alarm icon is associated with at least one control pixel in the at least one dead zone of the display screen.

18. The method of claim 16 further comprising:
    displaying a plurality of alarm icons in the at least one active zone of the display screen;
    providing at least two control pixels in the at least one dead zone adjacent two sides of the at least one active zone of the display screen; and
    enabling, in connection with a verification of their display, a two-dimensional identification distinguishing each of at least two alarm icons displayed in the active zone of the display screen.

19. The method of claim 16 further comprising:
    activating individually the one or more alarm icons;
    activating the at least one control pixel in response to individual activation of the one or more alarm icons;
    detecting, with the at least one light sensor, activation of the at least one control pixel;
    transmitting, with the at least one light sensor, a signal to the processing unit indicative of the activation state of the at least one control pixel;
    evaluating, with the processing unit, the operation of the display screen in response to individual activation of the one or more alarm icons.

\* \* \* \* \*